US007417479B2

(12) United States Patent
Kitayama

(10) Patent No.: US 7,417,479 B2
(45) Date of Patent: Aug. 26, 2008

(54) DUTY DETECTION CIRCUIT AND METHOD FOR CONTROLLING THE SAME

(75) Inventor: Makoto Kitayama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/401,889

(22) Filed: Apr. 12, 2006

(65) Prior Publication Data

US 2006/0232311 A1 Oct. 19, 2006

(30) Foreign Application Priority Data

Apr. 15, 2005 (JP) ............................. 2005-117750

(51) Int. Cl.
*H03K 3/017* (2006.01)
(52) U.S. Cl. ...................................... 327/175; 327/172
(58) Field of Classification Search .......... 327/172–175
See application file for complete search history.

(56) References Cited

U.S. PATENT DOCUMENTS

| | | | | |
|---|---|---|---|---|
| 6,084,452 A * | 7/2000 | Drost et al. | .................. | 327/175 |
| 6,373,309 B1 * | 4/2002 | Bang | ........................... | 327/175 |
| 6,583,657 B1 * | 6/2003 | Eckhardt et al. | ............. | 327/175 |
| 6,967,514 B2 * | 11/2005 | Kizer et al. | .................. | 327/175 |
| 7,119,594 B2 * | 10/2006 | Kim | ........................... | 327/175 |
| 7,199,634 B2 | 4/2007 | Cho et al. | | |
| 2002/0017936 A1 | 2/2002 | Stark et al. | | |
| 2005/0104640 A1 * | 5/2005 | Park | ........................... | 327/175 |
| 2005/0122149 A1 * | 6/2005 | Cho et al. | .................... | 327/175 |
| 2006/0170475 A1 * | 8/2006 | Monma et al. | ............... | 327/175 |

FOREIGN PATENT DOCUMENTS

| | | |
|---|---|---|
| JP | 61-071715 | 4/1986 |
| JP | 09-293374 | 11/1997 |
| JP | 11-127142 | 5/1999 |
| JP | 2001-144590 | 5/2001 |
| JP | 2001-326564 | 11/2001 |

(Continued)

OTHER PUBLICATIONS

Korean Office Action issued in Korean Patent Application No. KR 10-2006-0034337, mailed Oct. 23, 2007.
Japanese Office Action, with partial English translation, issued in Japansese Patent Application No. JP 2005-117750, mailed Nov. 13, 2007.

(Continued)

*Primary Examiner*—N. Drew Richards
*Assistant Examiner*—Patrick O'Neill
(74) *Attorney, Agent, or Firm*—McDermott Will & Emery LLP

(57) ABSTRACT

A duty detection circuit is provided with a main circuit unit that includes at least a first capacitor that is discharged during the time period in which the clock signal is at a high level and charged during the time period in which the clock signal is at a low level, and a second capacitor that is charged during the time period in which the clock signal is at a high level and discharged during the time period in which the clock signal is at a low level, with the main circuit unit alternately charging or discharging the first and second capacitors in synchrony with the clock signal; and a duty correction signal generator for detecting the potential difference of the first and second capacitors and outputting a duty correction signal based on the potential difference.

34 Claims, 14 Drawing Sheets

FOREIGN PATENT DOCUMENTS

| | | |
|---|---|---|
| JP | 2002-025266 | 1/2002 |
| JP | 2002-135105 | 5/2002 |
| JP | 2003-110411 | 4/2003 |
| JP | 2003-318705 | 11/2003 |
| JP | 2004-088679 | 3/2004 |
| JP | 2004-206879 | 7/2004 |
| KR | 2005-0055925 | 6/2005 |

OTHER PUBLICATIONS

Ogawa, T., et al., "A 50% duty control circuit for PLL output", The Institute of Electrical Engineers of Japan-Society for the Study of Electronic Circuits, Oct. 19, 2001, pp. 15-19.

Japanese Office Action, with Partial English Translation, issued in Japanese Patent Application No. 2005-027483, issued on Jan. 8, 2008.

\* cited by examiner

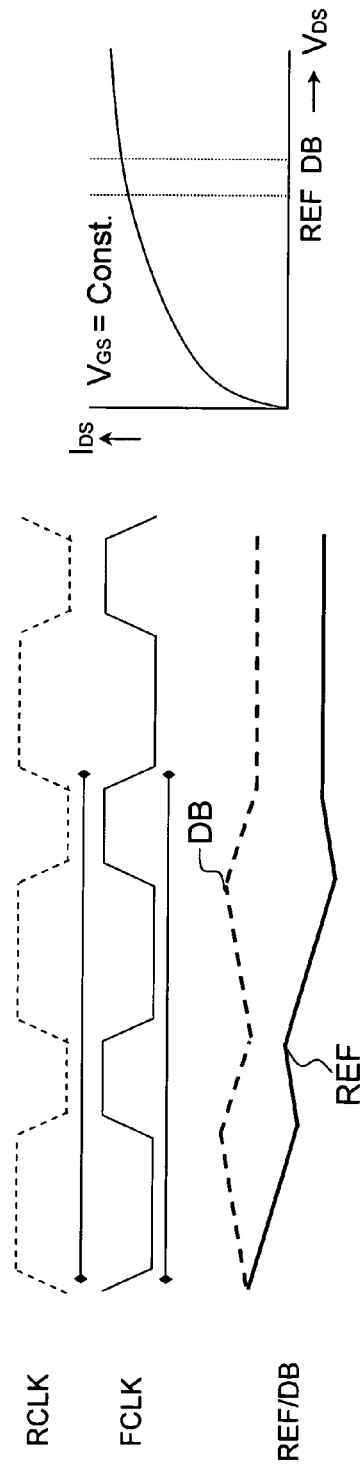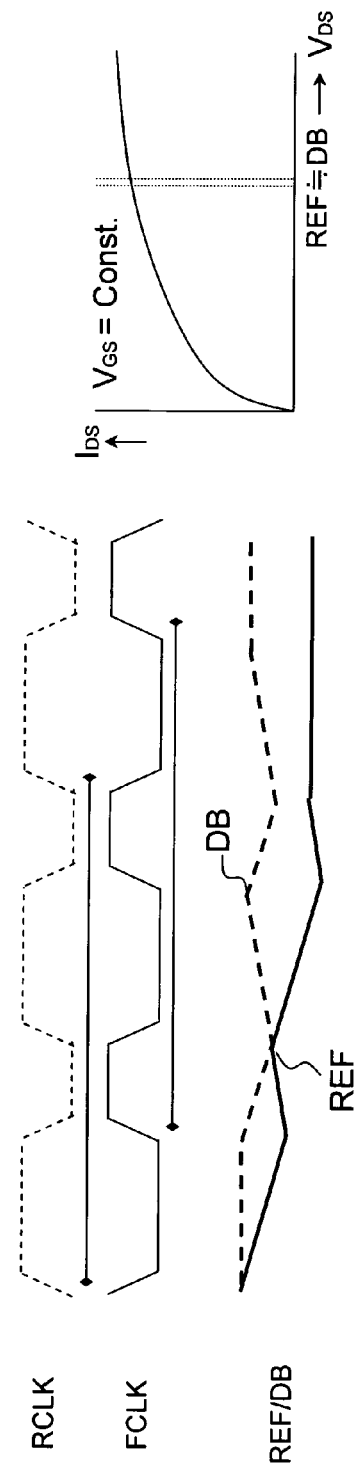
FIG.5A FIG.5B FIG.5C FIG.5D

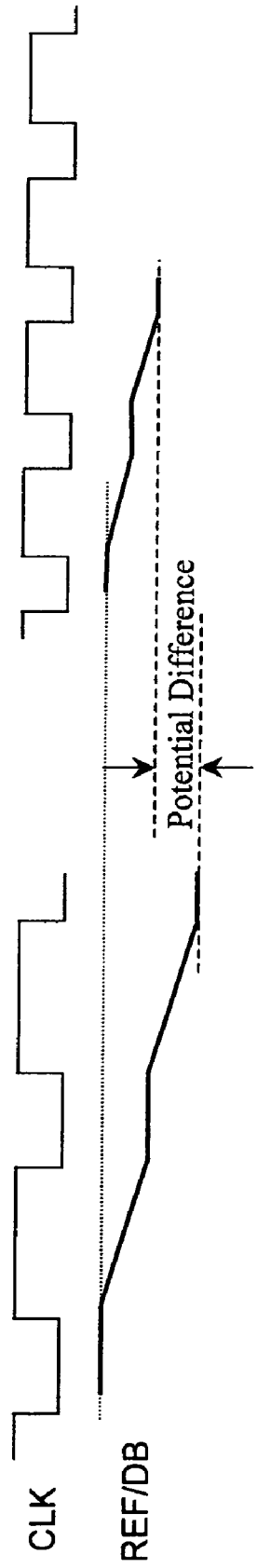

DUTY DETECTION CIRCUIT AND METHOD FOR CONTROLLING THE SAME

TECHNICAL FIELD

The present invention relates to a duty detection circuit and a method for controlling the same, and particularly relates to a duty detection circuit that detects a duty error in an internal clock and is used as part of a DLL (Delay Locked Loop) circuit for generating an internal clock that is synchronized with an external clock, and to a method for controlling the same.

BACKGROUND OF THE INVENTION

In DDR-SDRAM (Double Data Rate-Synchronous Dynamic Random Access Memory), a DLL (Delay Locked Loop) circuit for generating an internal clock synchronized with an external clock is used in order to minimize operational lag within the memory. The external clock signal must be inputted at the correct duty ratio (ratio of the high or low level of a signal in a cycle; the correct duty ratio in this case is 50%) in order for the DLL circuit to operate properly. However, a duty error of ±5% in the external clock signal is allowed by specification, and a larger duty error occurs when jitter and the like are considered. Therefore, after the duty error of the internal clock is detected by a duty detection circuit, this error must be corrected.

FIG. 9 is a simplified block diagram showing the structure of a DLL circuit.

In the DLL circuit 900 shown in FIG. 9, the external clock (CLK/CLKB) received by a clock receiver 901 is fed to a delay counter 903 through a clock controller 902, and an internal clock (RCLK/FCLK) is generated having a prescribed amount of delay. These signals are inputted to a data output unit 904 and to a duty detection circuit 906, and the duty difference is found in the duty detection circuit 906 by comparing the duty of the FLCK signal and RCLK signal. The output of a data output unit replica 905 that receives the RCLK signal is inputted to a phase comparison judgment unit 907, it is judged in the phase comparison judgment unit 907 whether the present state is ahead or delayed with respect to the external clock (CLK), and the result of this judgment is fed to a delay counter controller 908. The delay counter controller 908 controls the delay counter 903 based on the duty difference and the phase offset direction (ahead/delayed).

By this configuration, an internal clock (DQ/DQS) having no duty correction such as the one shown in FIG. 10A is outputted without modification when the DLL circuit does not have the duty detection circuit 906, but a signal in which the duty ratio is corrected to 50% (1:1) can be generated by the DLL circuit 900 having the duty detection circuit 906, as shown in FIG. 10B.

FIG. 11 is a simplified block diagram showing the structure of a conventional duty detection circuit.

As shown in FIG. 11, this duty detection circuit 200 comprises a main circuit unit 210 for receiving an RCLK signal and an FCLK signal as internal clock signals generated in the DLL circuit, and generating voltage levels (DB signal and REF signal) in accordance with the duty ratio of these internal clock signals (hereinafter referred to simply as clock signals); an amplifier 220 for amplifying the output of the main circuit unit 210; a latch circuit 230 for latching the output of the amplifier 220; a pre-charge unit 240 for charging (pre-charging) a capacitor inside the main circuit unit 210; and a transfer controller 250 for allowing discharge of a capacitor inside the main circuit unit 210. The RCLK signal in this arrangement is an internal clock signal having the same phase as the external clock signal, and the FCLK signal is an internal clock signal having the opposite phase of the external clock signal. Therefore, the RCLK signal and the FCLK signal are complementary to each other, and the term "duty ratio" is defined by the ratio at which the RCLK signal is at a high level (ratio at which the FCLK signal is at a low level).

The main circuit unit 210 comprises a capacitor C21 connected to a signal line S1; a capacitor C22 connected to a signal line S2; integration transistors Tr26 and Tr27 for receiving and switching the RCLK signal and the FCLK signal; and a bias transistor Tr28 inserted between the sources of the integration transistors Tr26 and Tr27 and the ground GND. A bias signal is fed to the bias transistor Tr28. The pre-charge unit 240 is composed of pre-charge transistors Tr21 through Tr23 for pre-charging the capacitors C21 and C22. A PreB signal for initiating pre-charging of the capacitors C21 and C22 is fed to the gates of the pre-charge transistors Tr21 through Tr23. The transfer controller 250 is composed of activation transistors Tr24 and Tr25 for allowing discharge of the capacitors C21 and C22, and an ActT signal that is an activation signal for initiating an actual integration operation is fed to the gates of the activation transistors Tr24 and Tr25.

The operation of the conventional duty detection circuit 200 will next be described with reference to FIG. 12. First, as shown in FIG. 12, when the pre-charge transistors Tr21 through Tr23 are placed in the ON state by the changing of the PreB signal to low-level, a charge is fed from the power source VDD to the capacitors C21 and C22, whereby the capacitors C21 and C22 are charged to the VDD. When the activation transistors Tr24 and Tr25 are placed in the ON state by the changing of the ActT signal to active (high-level), the charges with which the capacitors C21 and C22 were charged are alternately discharged in synchrony with the RCLK signal and FCLK signal. In other words, when the RCLK signal becomes high-level, the capacitor C21 is discharged through the activation transistor Tr24, the integration transistor Tr26, and the bias transistor Tr28; and when the FCLK signal becomes high-level, the capacitor C22 is discharged through the activation transistor Tr25, the integration transistor Tr27, and the bias transistor Tr28. Since the capacitors C21 and C22 are thereby discharged during the time period in which the RCLK signal and FCLK signal are each high-level, the potentials of the DB signal and the REF signal alternately decrease in the time period (integration operation period) in which the ActT signal is at a high level, as shown in the drawing.

The final output of the main circuit unit 210 is indicated by the potential difference between the REF signal that is the potential of the signal line S1 connected to the capacitor C21, and the DB signal that is the potential of the signal line S2 connected to the capacitor C22. The difference between these potentials is amplified by the amplifier 220, whereby a DCC signal (duty correction signal) is obtained as a 1-bit digital signal, and the DCC signal is latched in the latch circuit 230. In this arrangement, a low-level (VREF>DB) logical value for the DCC signal means that the duty ratio exceeds 50%, and a high-level (VREF<DB) logical value for the DCC signal means that the duty ratio is less than 50%. The DCC signal thus generated is fed to the delay counter controller 908 of the DLL circuit 900 described above, and the delay counter controller 908 changes the duty ratio of the clock signal based on this feedback. In other words, control is performed so that the duty ratio of the clock signal is reduced when the DCC signal is at a low level, and so that the duty ratio of the clock signal is increased when the DCC signal is at a high level. The DLL circuit causes the duty ratio of the clock signal to approach 50% by continuously performing this type of control.

The above-described conventional duty detection circuit 200 has the property that the charging level of the capacitor following removal of the charge by the integration operation fluctuates considerably according to the frequency of the clock signal. Specifically, when the clock (CLK) frequency is low, the levels of the REF signal and DB signal significantly decrease, as shown in FIG. 13A. However, as shown in FIG. 13B, the levels of the REF signal and DB signal decrease only moderately when the clock frequency is high. Drawbacks therefore occur in that the structure of the judgment circuit becomes complex when an attempt is made to adapt to such a large difference in levels.

When the duty difference of two clock signals is large, as shown in FIG. 14A, the final potential difference $\Delta V$ of the DB signal and the REF signal has a certain level after the capacitors are discharged by the integration operation. However, as shown in FIG. 14B, when there is almost no duty difference in the clock signals, the final potential difference $\Delta V$ of the DB signal and REF signal becomes extremely small. Therefore, when an attempt is made to adapt to such a minute potential difference, drawbacks occur in that a high-precision judgment circuit must be used, and the structure of the judgment circuit is complicated.

The problem of dependency on the clock frequency shown in FIG. 13 can be overcome to a certain extent by reducing the common source current or increasing the capacity of the capacitors. On the other hand, however, the problem of the output potential difference shown in FIG. 14 can be overcome to a certain extent by increasing the common source current or decreasing the capacity of the capacitors. Since the methods for overcoming the two problems described above are thus mutually exclusive, and both involve a trade-off, a new method for overcoming these problems must be found in order to achieve a high level of reconciliation between these methods.

Therefore, an object of the present invention is to provide a duty detection circuit capable of correctly operating in a wide range of frequencies without regard for the size of the duty difference; and to provide a method for controlling the same.

SUMMARY OF THE INVENTION

The abovementioned objects of the present invention are achieved by a duty detection circuit for detecting a duty of a clock signal and generating a duty correction signal based on the duty, wherein the duty detection circuit is provided with a main circuit unit that includes at least a first capacitor that is discharged during the time period in which the clock signal is at a high level and charged during the time period in which the clock signal is at a low level, and a second capacitor that is charged during the time period in which the clock signal is at a high level and discharged during the time period in which the clock signal is at a low level, with the main circuit unit alternately charging or discharging the first and second capacitors in synchrony with the clock signal; and a duty correction signal generator for detecting the potential difference of the first and second capacitors and outputting a duty correction signal based on the potential difference.

In the present invention, the main circuit unit preferably includes a first integration transistor for allowing the first capacitor to be charged during the time period in which the clock signal is at a low level; a second integration transistor for allowing the first capacitor to be discharged during the time period in which the clock signal is at a high level; a third integration transistor for allowing the second capacitor to be charged during the time period in which the clock signal is at a high level; a fourth integration transistor for allowing the second capacitor to be discharged during the time period in which the clock signal is at a low level; a first bias transistor for setting the rate at which the first and second capacitors are charged by defining the amount of bias current that flows to the first and third integration transistors; and a second bias transistor for setting the rate at which the first and second capacitors are discharged by defining the amount of bias current that flows to the second and fourth integration transistors.

It is furthermore preferred in the present invention that the first and third integration transistors and the first bias transistor be composed of P-channel MOS transistors; and that the second and fourth integration transistors and the second bias transistor be composed of N-channel MOS transistors.

It is furthermore preferred in the present invention that the amount of bias current set by the second bias transistor be larger than the amount of bias current set by the first bias transistor; and that the ratio of the bias current by the first bias transistor to the bias current by the second bias transistor be set to 2:3.

It is preferred that the duty detection circuit of the present invention be furthermore provided with a transfer controller for allowing charging and discharging of the first and second capacitors at a prescribed timing that is synchronized with the clock signal.

It is preferred in the present invention that the transfer controller allow charging and discharging of the first and second capacitors during an integer multiple of the period of the clock signal.

The transfer controller preferably allows charging and discharging of the first and second capacitors based on at least a logical signal generated by an activation signal, the clock signal, and the delay signal thereof.

It is preferred in the present invention that the transfer controller be configured so as to be able to allow charging and discharging of the first capacitor as well as charging and discharging of the second capacitor to occur independently.

In the present invention, the transfer controller preferably causes the time period in which charging and discharging of the first capacitor is allowed, and the time period in which charging and discharging of the second capacitor is allowed to be offset from each other by one-half cycle of the clock signal.

In the present invention, the transfer controller preferably causes charging and discharging of the second capacitor to be initiated one-half cycle of the clock signal after charging and discharging of the first capacitor is initiated.

It is preferred that the duty detection circuit of the present invention be furthermore provided with a pre-charge unit for pre-charging the first and second capacitors at a lower level than the level of a prescribed power source.

In the present invention, the pre-charge unit preferably includes a first pre-charge transistor connected between the prescribed power source and the first capacitor; and a second pre-charge transistor connected between the prescribed power source and the second capacitor; wherein the first and second pre-charge transistors are both composed of N-channel MOS transistors.

It is preferred that the duty detection circuit of the present invention be furthermore provided with a third capacitor provided so as to correspond to the first capacitor; and a fourth capacitor provided so as to correspond to the second capacitor; wherein the first and second capacitors are composed of N-channel MOS gate capacitors; and the third and fourth capacitors are composed of P-channel MOS gate capacitors.

In the present invention, the duty correction signal generator preferably includes an amplifier for amplifying the potential difference of the first and second capacitors; and a latch circuit for generating the duty correction signal based on the output of the amplifier.

The abovementioned objects of the present invention are also achieved by a method for controlling the duty detection circuit described above, comprising causing charging and discharging of the first capacitor to be initiated at a prescribed timing that is synchronized with the clock signal; and causing charging and discharging of the second capacitor to be initiated at a timing that is one-half cycle of the clock signal later than the time at which charging and discharging of the first capacitor was initiated.

BRIEF DESCRIPTION OF THE DRAWINGS

The above and other objects, features and advantages of the present invention will become more apparent by reference to the following detailed description of the invention taken in conjunction with the accompanying drawings, wherein:

FIGS. 5A through 5D are waveform diagrams for providing a more detailed description of the reason for delaying FCLK sampling by a half-cycle;

FIGS. 13A and 13B are waveform diagrams for explaining one problem of the conventional duty detection circuit.

DETAILED DESCRIPTION OF THE EMBODIMENTS

Preferred embodiments of the present invention will be described in detail hereinafter with reference to the accompanying drawings.

Figure 1:
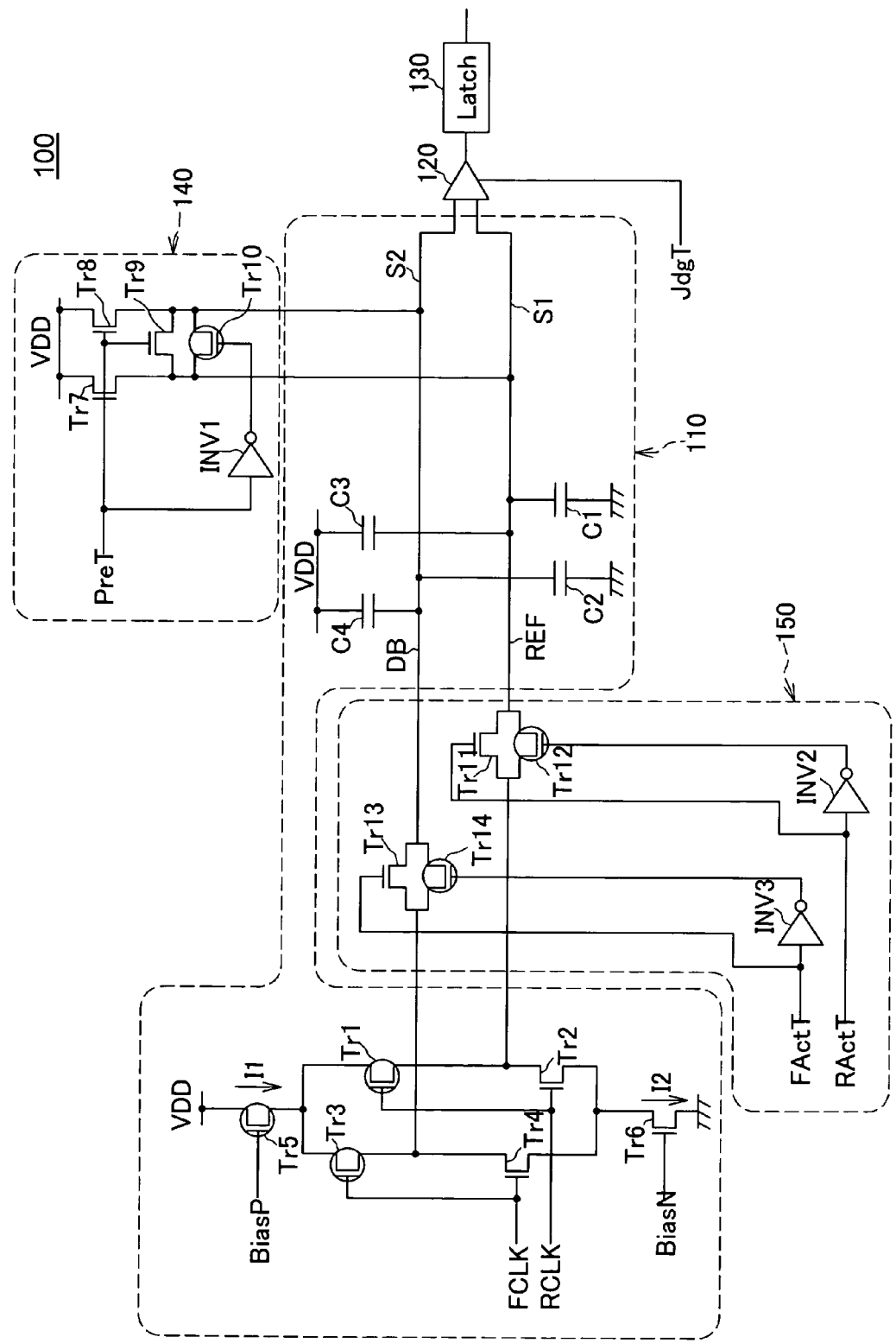
FIG. 1 is a circuit diagram showing the structure of the duty detection circuit according to a preferred embodiment of the present invention.

FIG. 1 is a circuit diagram showing the structure of the duty detection circuit according to a preferred embodiment of the present invention.

As shown in FIG. 1, the duty detection circuit 100 according to the present embodiment comprises a main circuit unit 110 for receiving an RCLK signal and an FCLK signal as internal clock signals generated by a DLL circuit, and generating voltage levels (DB signal and REF signal) in accordance with the duty ratio of these internal clock signals (hereinafter referred to simply as clock signals); an amplifier 120 for amplifying the output of the main circuit unit 110; a latch circuit 130 for latching the output of the amplifier 120; a pre-charge unit 140 for charging (pre-charging) a capacitor inside the main circuit unit 110; and a transfer controller 150 for allowing charging and discharging of a capacitor inside the main circuit unit 110.

Figure 2:
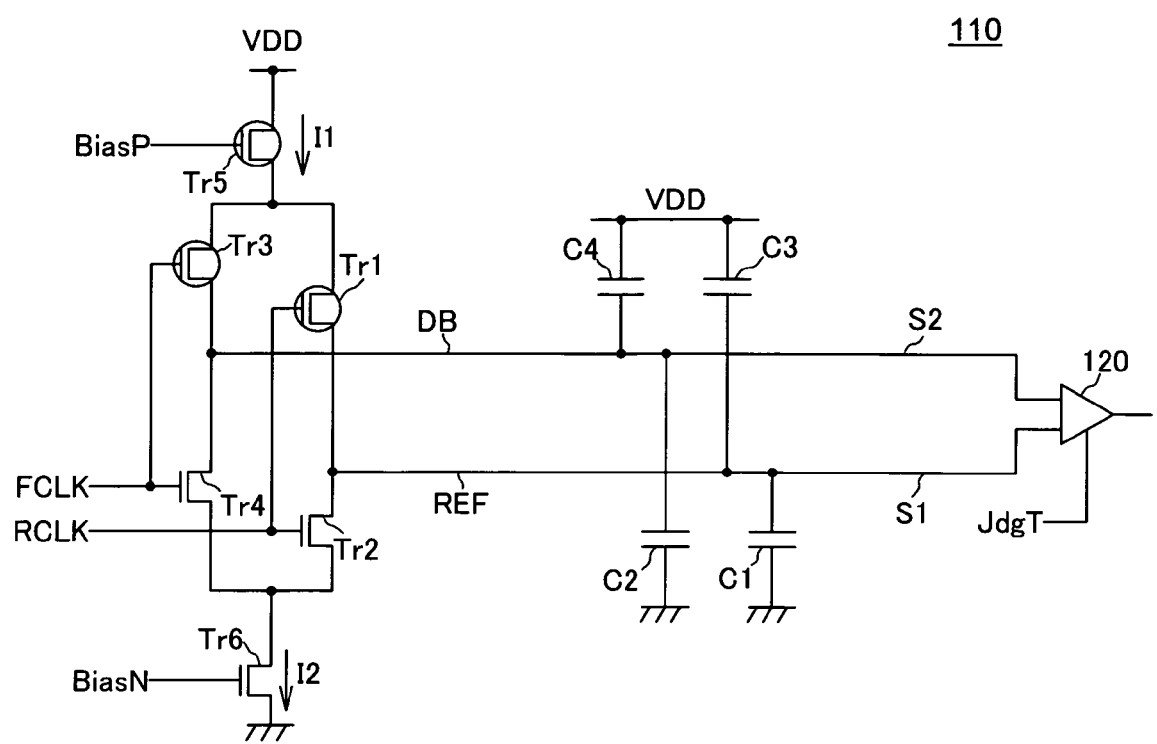
FIG. 2 is a circuit diagram primarily showing the main circuit unit 110 and the surrounding area.

FIG. 2 is a circuit diagram primarily showing the main circuit unit 110 and the surrounding area.

As shown in FIG. 2, the main circuit unit 110 comprises first and third capacitors C1 and C3 connected to a signal line S1; second and fourth capacitors C2 and C4 connected to a signal line S2; first through fourth integration transistors Tr1 through Tr4 for receiving the RCLK signal and the FCLK signal and switching; a first bias transistor Tr5 inserted between the sources of the integration transistors Tr1 and Tr3 and the power source VDD; and a second bias transistor Tr6 inserted between the sources of the integration transistors Tr2 and Tr4 and the ground GND.

One end of each of the capacitors C1 and C3 is connected to the signal line S1, the other end of the capacitor C1 is connected to the ground GND, and the other end of the capacitor C3 is connected to the power source VDD. Therefore, the potential of the signal line S1 can assume any potential from the VDD to zero according to the charge/discharge state of the capacitors C1 and C3. In the same manner, one end of each of the capacitors C2 and C4 is connected to the signal line S2, the other end of the capacitor C2 is connected to the ground GND, and the other end of the capacitor C4 is connected to the power source VDD. Therefore, the potential of the signal line S2 can assume any potential from the VDD to zero according to the charge/discharge state of the capacitors C2 and C4. The potentials of the signal lines S1 and S2 are fed to the amplifier 120 as a REF signal and a DB signal, respectively.

The integration transistors Tr1 and Tr2 are switches for causing the capacitors C1 and C3 to charge and discharge in alternating fashion, and the common drain of the integration transistor Tr1 and the integration transistor Tr2 is connected to one end of the signal line S1. The integration transistor Tr1 is composed of a P-channel MOS transistor (hereinafter referred to simply as a Pch transistor), and the integration transistor Tr2 is composed of an N-channel MOS transistor (hereinafter referred to simply as an Nch transistor). The RCLK signal is fed in common to the gates of the integration transistors Tr1 and Tr2.

The integration transistors Tr3 and Tr4 are switches for causing the capacitors C2 and C4 to charge and discharge in alternating fashion, and the common drain of the integration transistor Tr3 and the integration transistor Tr4 is connected to one end of the signal line S2. The, integration transistor Tr3 is composed of a Pch transistor, and the integration transistor Tr4 is composed of an Nch transistor. The FCLK signal is fed in common to the gates of the integration transistors Tr3 and Tr4.

The bias transistors Tr5 and Tr6 are transistors for causing bias currents I1 and I2 to flow. Since the bias transistor Tr5 is a Pch transistor, and a BiasP signal is always applied to the gate thereof, the bias transistor Tr5 serves as a constant-current source for supplying a common source current I1. Since the bias transistor Tr6 is an Nch transistor, and a BiasN signal is always applied to the gate thereof, the bias transistor Tr6 serves as a constant-current source for supplying a common source current I2. In the present embodiment, the discharge of the capacitors is greater than the charge of these capacitors, and the common source current I2 of the bias transistor Tr6 is therefore set so as to be slightly larger than the common source current I1 of the bias transistor Tr5. More specifically, I1:I2=2:3.

In the main circuit unit 110 of the duty detection circuit 100 thus configured, the circuit composed of the capacitors C1 and C3, the integration transistors Tr1 and Tr2, and the bias transistors Tr5 and Tr6 constitutes an integration circuit for the RCLK signal; and the circuit composed of the capacitors C2 and C4, the integration transistors Tr3 and Tr4, and the bias transistors Tr5 and Tr6 constitutes an integration circuit for the FCLK signal.

Figure 3:
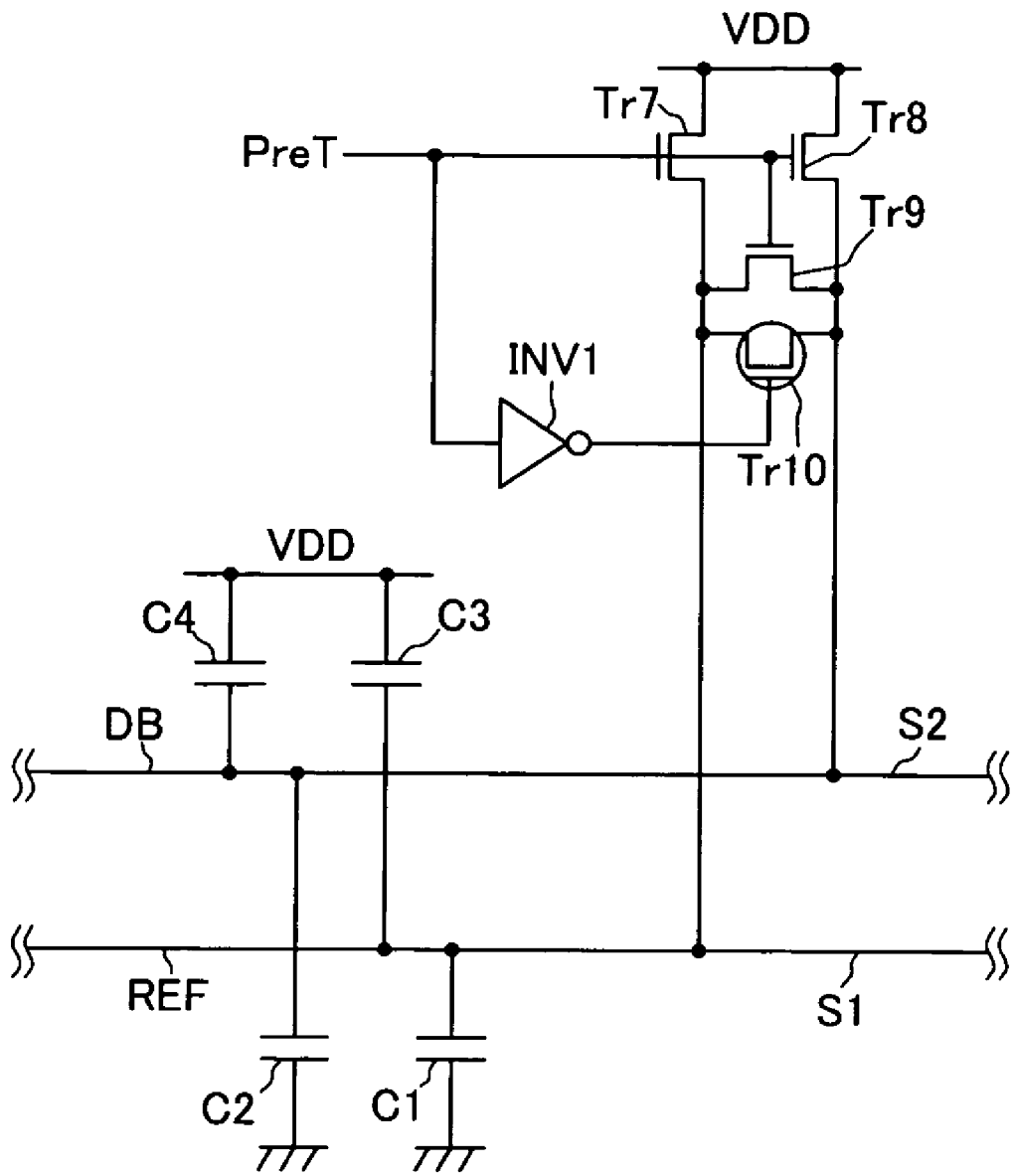
FIG. 3 is a circuit diagram primarily showing the pre-charge unit 140 and the surrounding area.

FIG. 3 is a circuit diagram primarily showing the pre-charge unit 140 and the surrounding area.

The pre-charge unit 140 is primarily composed of first and second pre-charge transistors Tr7 and Tr8 for pre-charging the capacitors C1 and C2. A detailed description will be given hereinafter, but in the present embodiment, the pre-charge transistors Tr7 and Tr8 are composed of Nch transistors. The signal lines S1 and S2 are each connected to the power source VDD via the pre-charge transistors Tr7 and Tr8. Therefore, when the PreT signal is fed to the gates of the pre-charge transistors Tr7 and Tr8 to establish the ON state, the capacitors C1 and C2 connected to the signal lines S1 and S2, respectively, are each charged from the power source VDD potential to a potential (VDD-Vt) obtained by subtracting the threshold voltage (Vt) of the pre-charge transistors Tr7 and Tr8. Conversely, the capacitors C3 and C4 are charged to potential Vt at both ends. Since the charging levels of the capacitors C3 and C4 are always complementary to those of the capacitors C1 and C2, only the state of the capacitors C1 and C2 will be described hereinafter, and the state of the capacitors C3 and C4 will not be described.

Nch transistors are used for the pre-charge transistors Tr7 and Tr8 for the following reasons. When a capacitor is only discharged in the duty detection operation, as in the conventional technique, pre-charging to the maximum level of the power source VDD is preferably performed by using a Pch pre-charge transistor. However, when a capacitor is charged in addition to being discharged, as in the present embodiment, even if the duty detection operation is begun after the charge of the capacitor is drawn-off, a small charge is first applied and charge removal is then started in the process in which the duty ratio of the clock signal is gradually brought to 50%. In such a case, when the pre-charge level of the capacitor is set to the maximum level of the power source VDD, it can become impossible to receive the portion that corresponds to this slight potential increase. Therefore, in the present embodiment, this type of drawback is overcome by setting the pre-charge levels of both the DB signal and the REF signal to a level that is less than that of the power source VDD by a value equal to the threshold of the Nch transistor, that is, to the VDD-Vt level.

The transistors Tr9 and Tr10 of the pre-charge unit 140 are provided in order to create a charge balance by short-circuiting the two signal lines S1 and S2. The transistor Tr9 is composed of an Nch transistor, and a PreT signal is inputted to the gate thereof. The transistor Tr10 is composed of a Pch transistor, and the PreT signal is inputted to the gate thereof via an inverter INV1.

Figure 4:
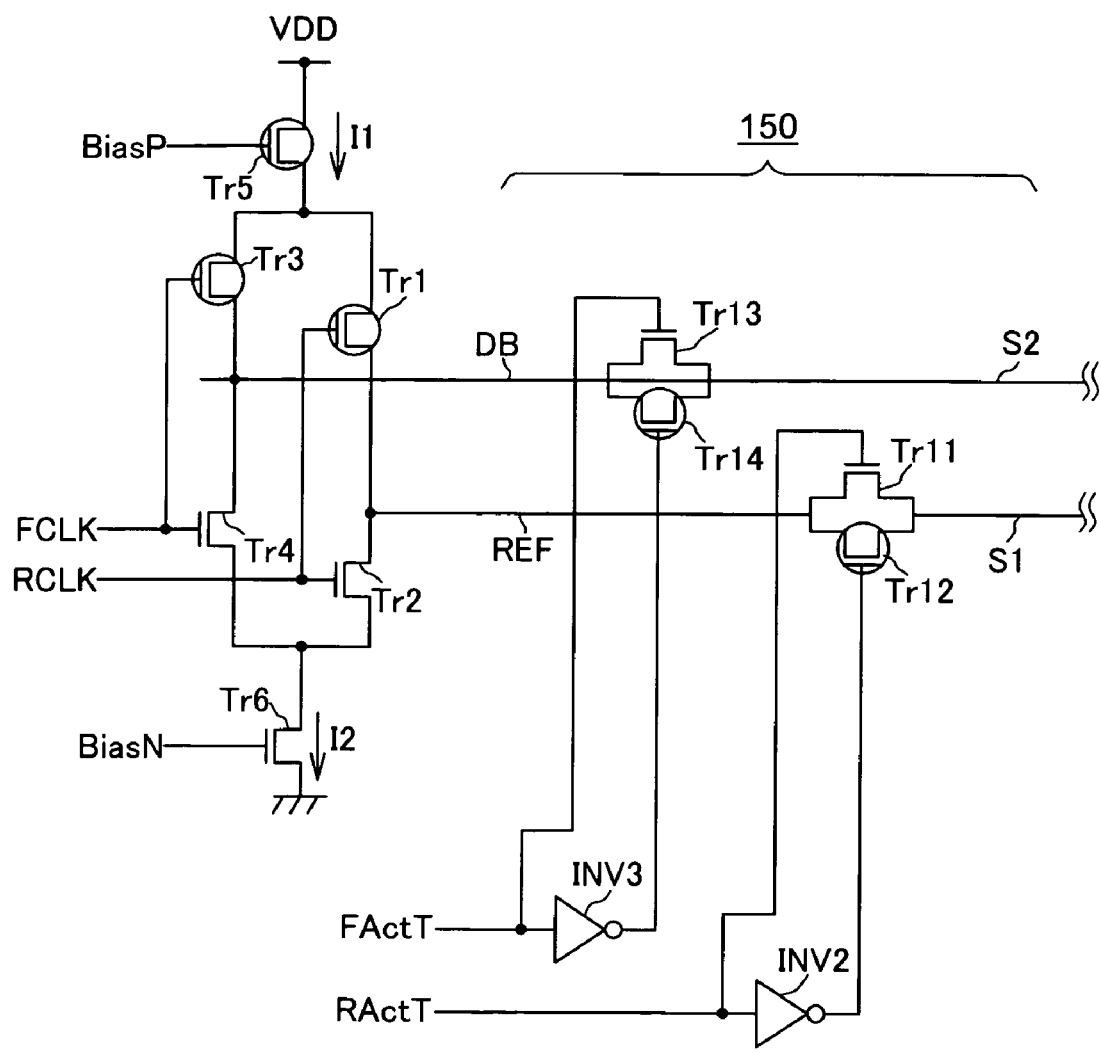
FIG. 4 is a circuit diagram primarily showing the transfer controller 150 and the surrounding area.

FIG. 4 is a circuit diagram primarily showing the transfer controller. 150 and the surrounding area.

The transfer controller 150 is composed of activation transistors Tr11 through Tr14 for allowing charging and discharging of the capacitors C1 through C4 (see FIG. 1 and other drawings) connected to the signal lines S1 and S2. The activation transistors Tr11 and Tr12 are both provided on the signal line S1. The activation transistor Tr11 is composed of an Nch transistor, and the activation transistor Tr12 is composed of a Pch transistor. An activation signal RActT is inputted to the gate of the activation transistor Tr11, and the RActT signal is inputted to the gate of the activation transistor Tr12 via an inverter INV2. By this configuration, the signal line S1 changes to the enabled state at the timing at which the RActT signal changes to active (high-level), and the capacitors C1 and C3 are charged and discharged through the switching action of the integration transistors Tr1 and Tr2.

The activation transistors Tr13 and Tr14 are both provided on the signal line S2. The activation transistor Tr13 is composed of an Nch transistor, and the activation transistor Tr14 is composed of a Pch transistor. An activation signal FActT is inputted to the gate of the activation transistor Tr13, and the FActT signal is inputted to the gate of the activation transistor Tr14 via an inverter INV3. By this configuration, the signal line S2 changes to the enabled state at the timing at which the FActT signal changes to active (high-level), and the capacitors C1 and C3 are charged and discharged through the switching action of the integration transistors Tr3 and Tr4. The transfer controller 150 is thus configured so as to be capable of independently controlling the charging and discharging of the capacitors C1 and C3 as well as the charging and discharging of the capacitors C2 and C4.

The period of time (RCLK sampling period) in which the activation transistors Tr11 and Tr12 are ON is the period in which the RActT signal changes to active (high-level), and is preferably set to an integer multiple (=nT; wherein n is a nonnegative number) of the period T of the clock signal. When the RCLK sampling period is too short, the capacitor C1 cannot be adequately discharged because the potential difference between the DB signal and the REF signal cannot be maintained. When the RCLK sampling period is too long, the potential of the REF signal decreases too much because the potential of the REF signal can fall outside the operational range of the amplifier 120. Consequently, the RCLK sampling period must be set to an appropriate value with consideration for the reasons described above. The RCLK sampling period in the present embodiment is set to 2 T. In the same manner, the FCLK sampling period is also preferably set to an integer multiple of the period T of the clock signal, and is set to 2 T in the present embodiment. When the period in which at least one of the signal lines S1 and S2 is activated is defined as the "integration operation period," the integration operation time in the present embodiment becomes 2.5 T.

Furthermore, in the present embodiment, the FActT signal becomes active one-half cycle later than the RActT signal, and the FCLK sampling period is initiated one-half cycle later than the RCLK sampling period. The capacitors C1 and C2 are charged and discharged in synchrony with the RCLK signal and the FCLK signal, respectively. However, when the RCLK sampling period and the FCLK sampling period are synchronized, one of the capacitors C1 and C2 starts from the discharge operation, and the other starts from the charging operation. As a result, the drain-source voltage VDS of the bias transistors Tr5 and Tr6 changes due to the difference in the charge level immediately after the start of the sampling period, which affects the bias currents I1 and I2. The manner in which charge leaves the capacitors C1 and C2 is thereby changed, and it can be impossible to perform a reliable judgment.

FIGS. 5A through 5D are waveform diagrams for providing a more detailed description of the reason for delaying FCLK sampling by a half-cycle.

As shown in FIG. 5A, when sampling of the RCLK signal and the FCLK signal is initiated simultaneously, sampling begins in the capacitor C1 from the removal of the charge, and begins in the capacitor C2 from the application of the charge. In this arrangement, the common source current (bias current) I1 governing the charging rate of the capacitors C1 and C2, and the common source current I2 governing the discharge rate of the capacitors are judged by the gate-source voltage VGS of the bias transistors Tr5 and Tr6. However, the common source current fluctuates due to the effect of the drain-source voltage VDS of the bias transistors, which can be considered smaller than the effect of the VGS.

More specifically, as shown in FIG. 5B, the common source current IGS increases because of an increase in VDS in the case of the DB signal, which is output from the capacitor C2 in which a charge is first applied and then drawn off. In contrast, there is no increase in the common source current IDS because the VDS does not increase in the case of the REF signal, which is output from the capacitor C1 in which the charge is initially drawn off. The VDS thus changes based on the charge level difference when the charge is initially drawn off from the capacitors C1 and C2, whereby the IDS also changes. The charge removal conditions are thereby changed, and a reliable judgment cannot be performed.

In contrast, when the start timings of the RCLK sampling period and the FCLK sampling period are offset by one-half cycle as shown in FIG. 5C, the capacitors C1 and C2 both start from the removal of the charge. In this case, since the VDS has the same level for both, as shown in FIG. 5D, there is also no variation of the common source current IDS. In the present embodiment, the charge level is thereby prevented from fluctuating when the charge is first drawn off from the capacitors C1 and C2, the charge removal conditions are made the same, and reliable judgment becomes possible. The start timing of the FCLK sampling period is therefore delayed by one-half clock cycle with respect to the RCLK sampling period.

Figure 9:
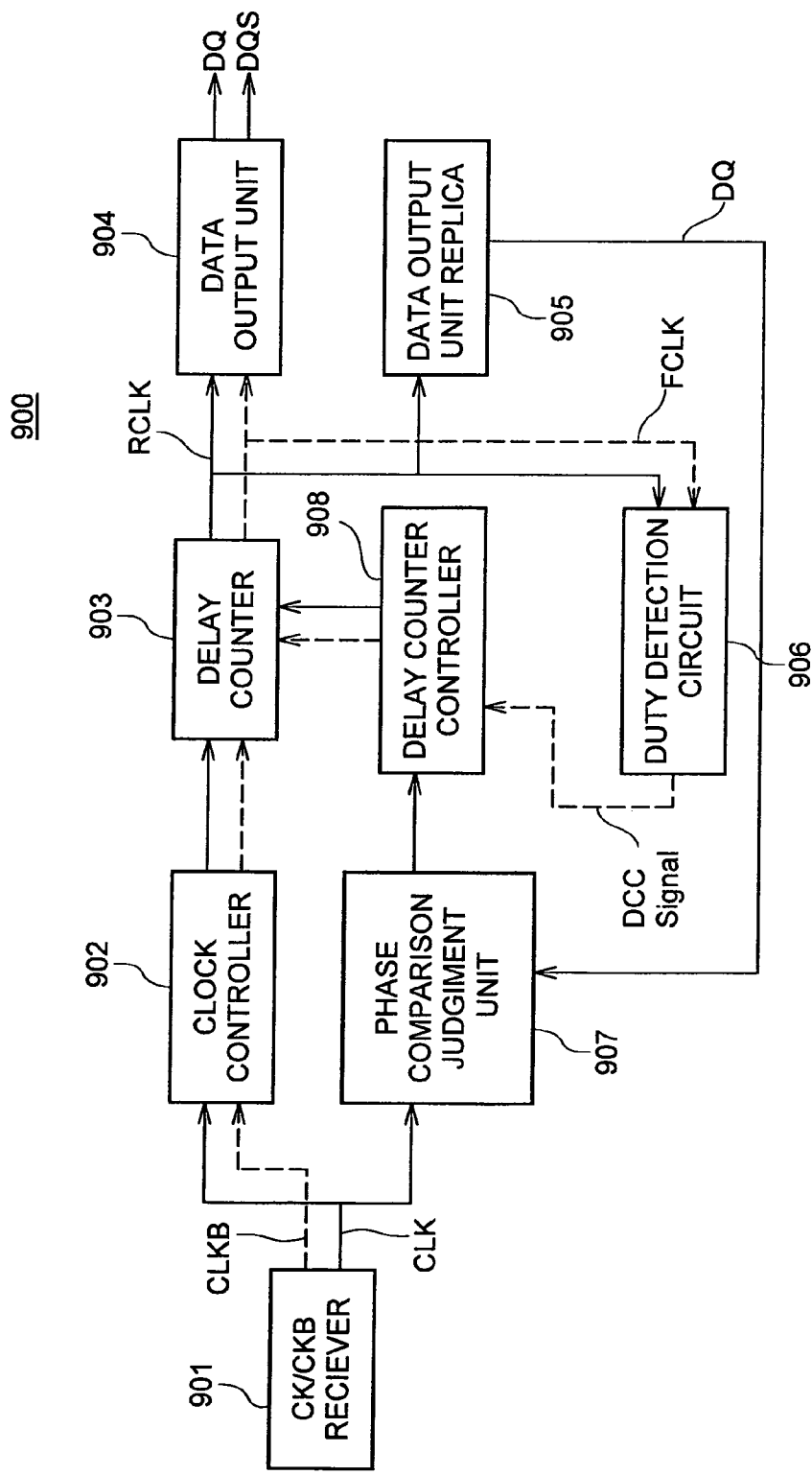
FIG. 9 is a simplified block diagram showing the structure of a DLL circuit.
Figure 10A:
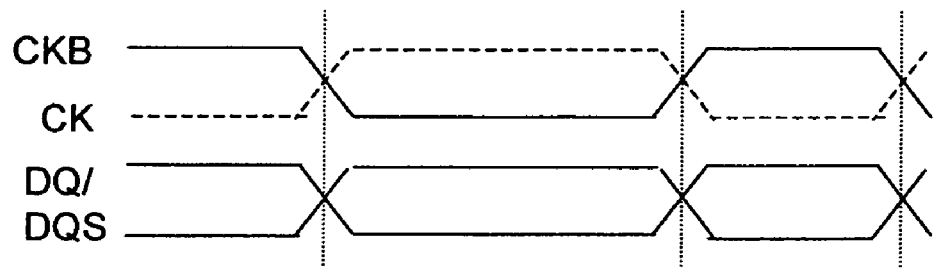
FIGS. 10A and 10B are operational waveform diagrams for explaining the operation of the DLL circuit 100.
Figure 10B:
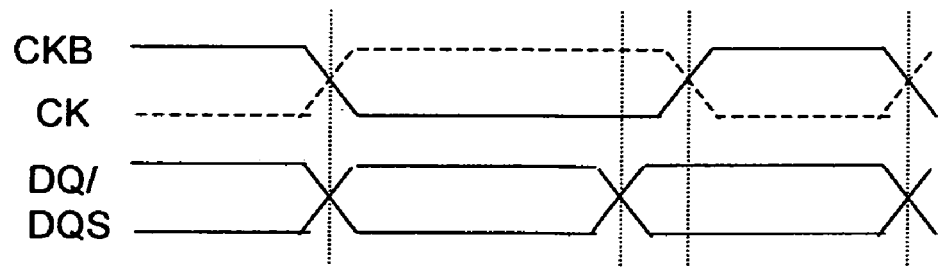
Figure 11:
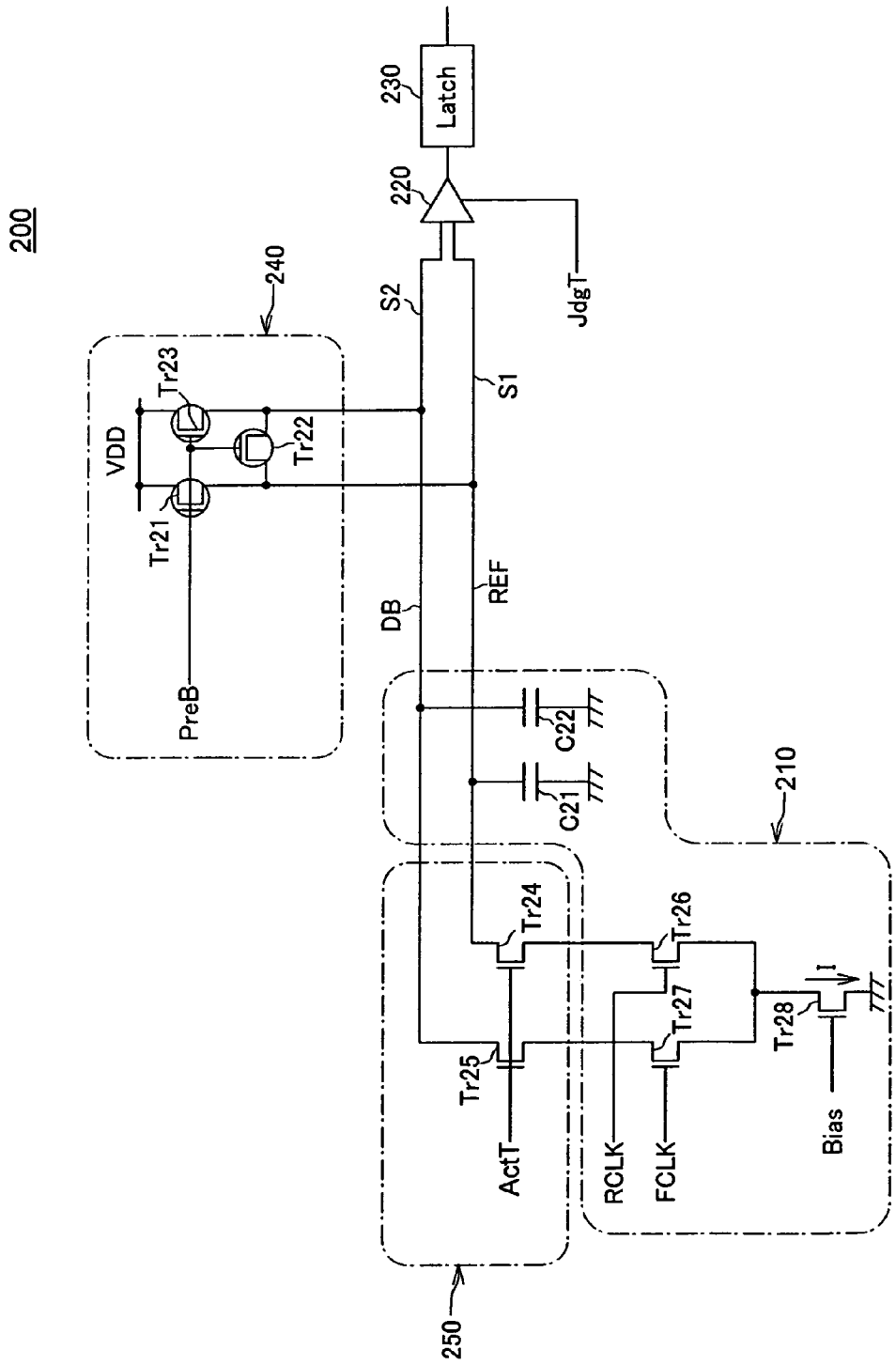
FIG. 11 is a simplified block diagram showing the structure of a conventional duty detection circuit.
Figure 12:
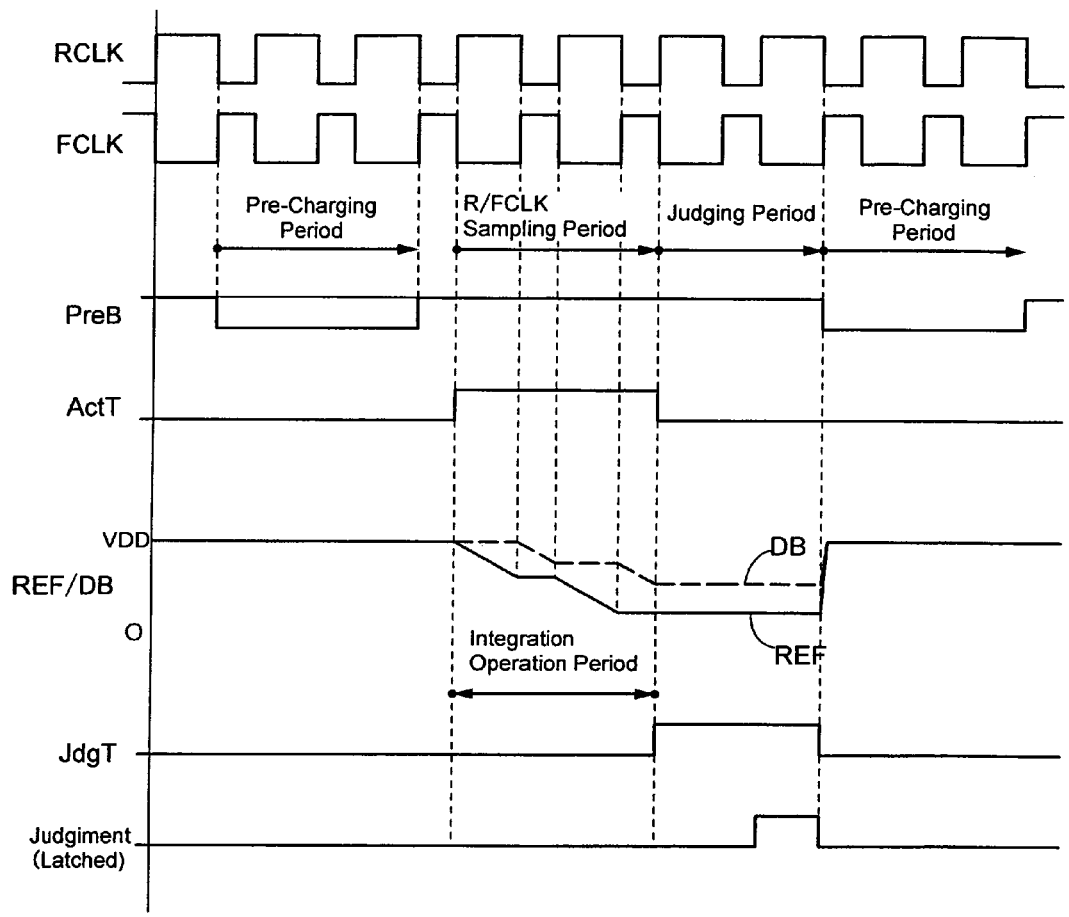
FIG. 12 is an operational waveform diagram for explaining the operation of the conventional duty detection circuit 200.
Figure 14A:
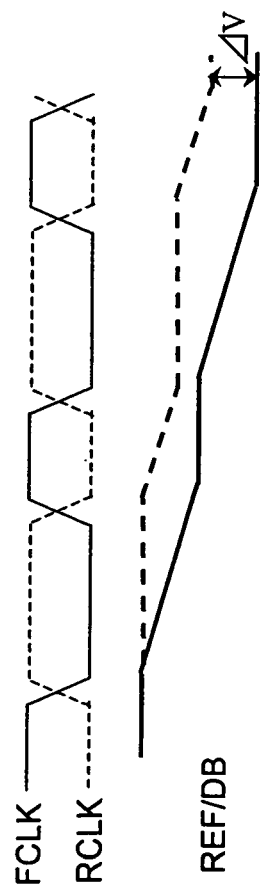
FIGS. 14A and 14B are waveform diagrams for explaining another problem of the conventional duty detection circuit.
Figure 14B:
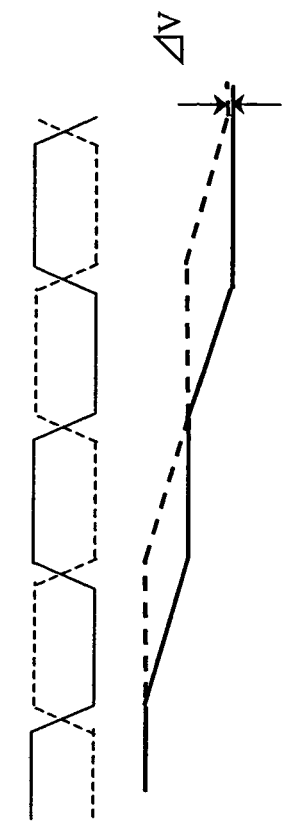

As shown in FIG. 1, the final output of the main circuit unit 110 is equal to the difference in potential between the DB signal that is the potential of the signal line S2 connected to the capacitors C2 and C4, and the REF signal that is the potential of the signal line S1 connected to the capacitors C1 and C3. In other words, this main circuit unit 110 can be considered to be a differential circuit for the voltage conversion of the difference between the period in which the RCLK signal is at a high level, and the period in which the FCLK signal is at a high level. These potential differences are amplified by the amplifier 120, and then latched by the latch circuit 130, whereby a DCC signal (duty correction signal) that is a 1-bit digital signal is obtained. As also shown in FIG. 9, this DCC signal is inputted to a delay counter controller in the DLL circuit, the delay counter controller controls the delay counter based on this input, and the duty ratio of the RCLK signal and the FCLK signal is caused to approach 50%. This type of duty detection operation is repeatedly executed during the period in which the DLL circuit is in operation.

The operation of the duty detection circuit 100 thus configured will be described in detail with reference to FIG. 6, which is an operational waveform diagram.

Figure 6:
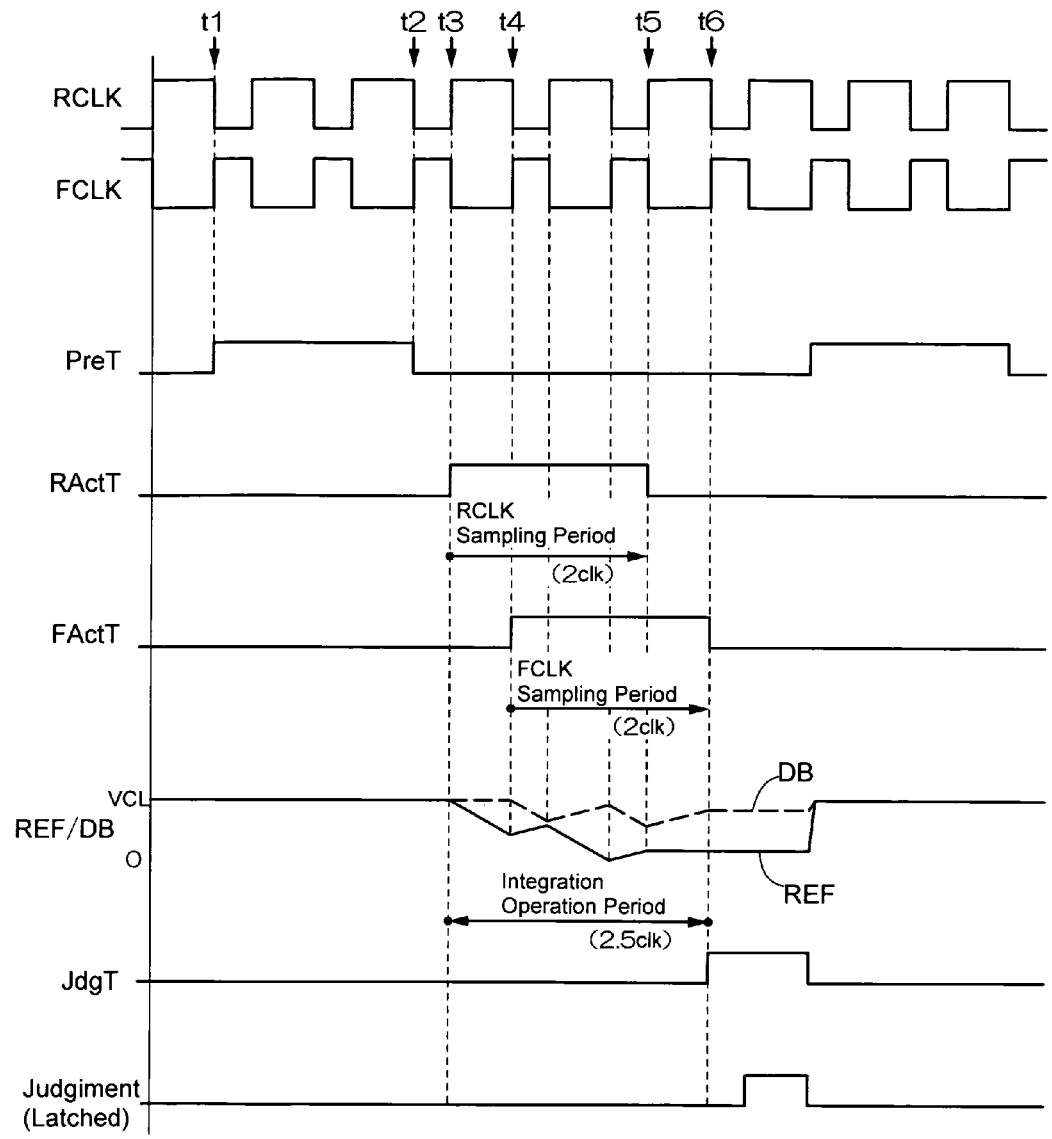
FIG. 6 is an operational waveform diagram for explaining the operation of the duty detection circuit 100.

As shown in FIG. 6, when a PreT signal first becomes active (high-level) at timing $t_1$, the pre-charge transistors Tr7 through Tr10 all change to the ON state. Feeding of charge from the power source VDD therefore begins. Since the FActT signal and the RActT signal are both inactive (low-level) at this time, and the activation transistors Tr11 through Tr14 are all in the OFF state, the current path leading to the ground GND through the transistor Tr2 or the transistors Tr4 and Tr6 is blocked. Therefore, the entire charge from the power source VDD flows to the capacitors C1 through C4, and the capacitors C1 and C2 are thereby pre-charged. Then, when the PreT signal becomes inactive (low-level) at timing $t_2$, the pre-charge transistors Tr7 through Tr10 all change to the OFF state, and charge stops being fed from the power source VDD.

When the RActT signal then becomes active (high-level) at timing $t_3$, the activation transistors Tr11 and Tr12 both change to the ON state. Charging and discharging of the capacitor C1 therefore begin. At this time, since the integration transistor Tr1 is OFF, and the integration transistor Tr2 is ON in the period in which the RCLK signal is active (high-level), the charge accumulated in the capacitor C1 is released. Also, since the integration transistor Tr1 is ON, and the integration transistor Tr2 is OFF in the period in which the RCLK signal is inactive (low-level), a charge is applied to the capacitor C1. The capacitor C1 is thus repeatedly charged and discharged in alternating fashion according to the RCLK signal. However, since a larger amount of current is set for the common source current I2 on the discharging side than for the common source current I1 on the charging side, the amount of charge in the capacitor C1 gradually decreases as charging and discharging are repeated.

Then, when the FActT signal becomes active (high-level) at timing $t_4$ that is delayed one-half cycle of the RCLK signal (or the FCLK signal) from timing $t_3$, the activation transistors Tr13 and Tr14 both change to the ON state. Charging and discharging of the capacitor C2 therefore begin in the same manner as that of the capacitor C1. At this time, since the integration transistor Tr3 is OFF, and the integration transistor Tr4 is ON in the period in which the FCLK signal is active (high-level), the charge accumulated in the capacitor C2 is released. Also, since the integration transistor Tr3 is ON, and the integration transistor Tr4 is OFF in the period in which the FCLK signal is inactive (low-level), a charge is applied to the capacitor C2. The capacitor C2 is thus repeatedly charged and discharged in alternating fashion according to the FCLK signal. However, since a larger amount of current is set for the common source current I2 on the discharging side than for the common source current I1 on the charging side, the amount of charge in the capacitor C2 gradually decreases as charging and discharging are repeated.

Since the RCLK signal and the FCLK signal are complementary signals in this arrangement, the capacitor C1 is discharged when the capacitor C2 is charged, the capacitor C2 is charged when the capacitor C1 is discharged, and charging and discharging are performed in alternating fashion. The RActT signal changes to inactive (low-level) at timing $t_5$ in which a certain period of time (period of 2 T in the present embodiment) has elapsed, and then the FActT signal changes to inactive (low-level) at timing $t_6$ delayed by one-half cycle. The entire integration operation period is thereby ended, and the operation for charging and discharging the capacitors C1 and C2 is completed.

The JdgT signal then changes to active (high-level) at timing $t_6$, and the amplifier 120 receives the DB signal and the REF signal at that timing. The potential difference between these signals is therefore received by the latch circuit 130. The output of the latch circuit 130 is then fed as the DCC signal to the delay counter controller in the DLL circuit. The operation described above is repeatedly executed during the period in which the DLL circuit is in operation. It thereby becomes possible for the DLL circuit to stabilize the duty ratio of the clock signal to nearly 50%.

As described above, by the duty detection circuit 100 of the present embodiment, not only are the capacitors C1 and C2 discharged when the RCLK signal and FCLK signal are active, but the capacitors C1 and C2 are also charged when the RCLK signal and FCLK signal are inactive, and charging and discharging of the capacitors C1 and C2 are performed in alternating fashion. It is therefore possible to suppress wide variations of the level of the DB signal and REF signal during judgment. Since charging and discharging of the capacitors act towards magnifying the potential difference between the DB signal and the REF signal, the potential difference between the DB signal and the REF signal can be increased even when the duty ratio is slightly offset from 50%. Specifically, the potential difference between the DB signal and the REF signal can be adequately maintained while minimizing significant decreases in the level thereof during judgment.

By the present embodiment, since the sampling period of the RCLK signal and the sampling period of the FCLK signal are offset by one-half cycle, no substantial difference occurs in the charging and discharging conditions of the capacitors C2 and C1. Therefore, a correct potential that reflects the duty can be obtained as the potential of the DB signal and REF signal.

By the present embodiment, Nch transistors are used as the pre-charge transistors Tr7 and Tr8 of the pre-charge unit 140, and the pre-charge level of the capacitors C1 and C2 during pre-charging is set to a level that is lower than the maximum level of the power source VDD. Therefore, saturation does not occur even when the capacitors C1 and C2 are charged by the duty detection operation, and the potential increases beyond the original pre-charging level.

Figure 7:
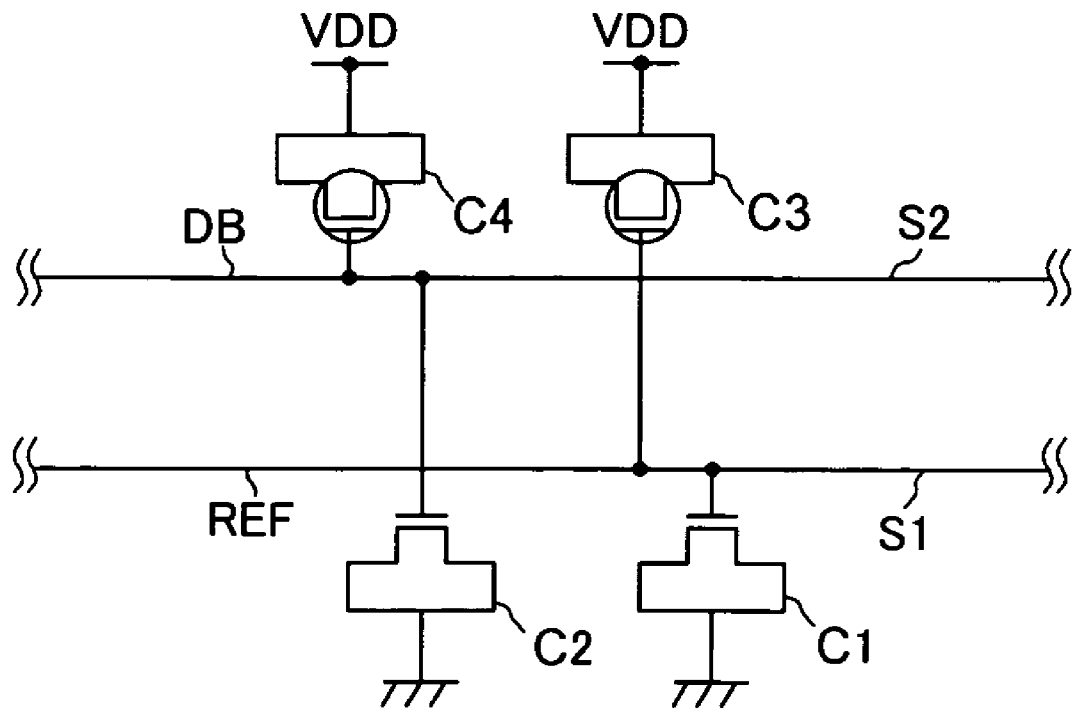
FIG. 7 is a circuit diagram showing another embodiment of the capacitors C1 through C4.

FIG. 7 is a circuit diagram showing another embodiment of the capacitors C1 through C4.

As shown in FIG. 7, gate capacitors are preferably used as the capacitors C1 through C4, among which Nch gate capacitors are preferably used as the capacitors C1 and C2, and Pch gate capacitors are preferably used as the capacitors C3 and C4. In the present embodiment, since both charging and discharging of the capacitors are performed, the potential of the DB signal or REF signal fluctuates significantly, and in some cases momentarily borders on a negative potential. When the potential decreases too far in this manner, the channel of the Nch gate capacitor turns OFF, and capacitor performance is significantly reduced. In such cases, a Pch gate capacitor functions in auxiliary fashion in order to compensate for the inadequacies of an Nch gate capacitor.

Figure 8:
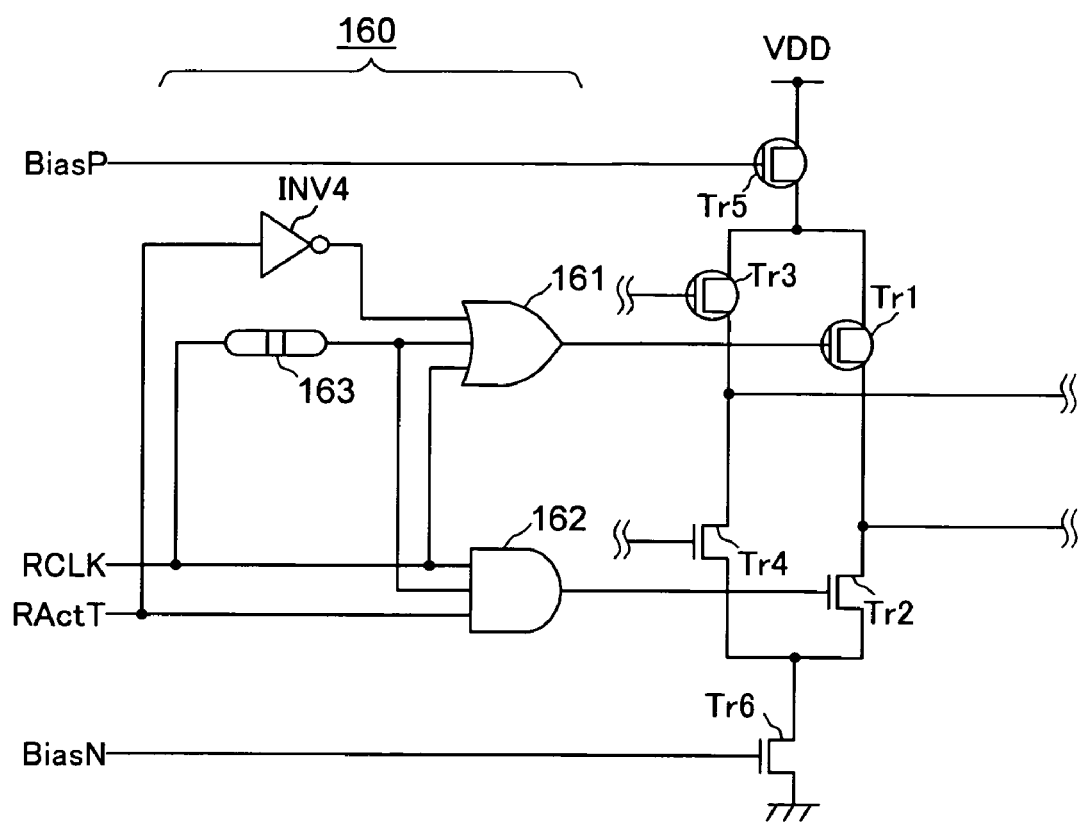
FIG. 8 is a circuit diagram showing another embodiment of the transfer controller.

FIG. 8 is a circuit diagram showing another embodiment of the transfer controller. In the same manner as in FIG. 4, the circuit structure of the transfer controller on the FCLK signal side is the same as the circuit structure on the RCLK signal side. Therefore, only the RCLK signal side is described herein, and description of the FCLK signal side is omitted.

As shown in FIG. 8, the present embodiment differs with respect to the transfer controller 150 of FIG. 4 in that the RCLK signal is inputted to the transistors Tr1 and Tr2 via the transfer controller 160. This transfer controller 160 is primarily composed of an OR gate 161 and an AND gate 162. The output terminal of the OR gate 161 is connected to the gate of the transistor Tr1, and the output terminal of the AND gate 162 is connected to the gate of the transistor Tr2. The OR gate 161 is presented with the RCLK signal and its delay signal, as well as the RActT signal via an inverter INV4. The delay signal of the RCLK signal is generated by a delay circuit 163. The logical sum of these signals is fed to the gate of the transistor Tr1. Therefore, even when the rising edges of the RCLK signal and the RActT signal are slightly offset from each other, the timing of each can be synchronized, and the gate can be opened. The RCLK signal and its delay signal are inputted to the AND gate 162, and the RActT signal is also directly inputted thereto. The logical product of these signals is fed to the gate of the transistor Tr2. Therefore, even when the rising edges of the RCLK signal and the RActT signal are slightly offset from each other, the timing of each can be synchronized, and the gate can be opened.

As described above, with the transfer controller 160 of the present embodiment, it is possible to reliable establish the timing between the RCLK signal and the RActT signal, and the timing between the FCLK signal and the FActT signal. Therefore, the integration operation can be executed without errors, and highly precise duty detection can be performed. Since it is no longer necessary to provide the transfer controller between the signal lines S1 and S2, it becomes possible to obtain a more correct duty-reflecting potential as the potential of the DB signal and the REF signal.

Preferred embodiments of the present invention were described above, but the present invention is in no way limited by the abovementioned embodiments, and various modifications are also possible within the intended scope of the present invention. It is apparent that such modifications are also encompassed by the present invention.

For example, in the embodiments described above, a case was described in which [operation] was initiated after removal of a charge, but [operation] may also be initiated after applying a charge. The balance of charging and discharging of the capacitors should then be considered in the setting of the pre-charge level; for example, the pre-charge level may be set to VDD/2 when the bias currents I1 and I2 are equal.

In the embodiments described above, the two capacitors C2 and C4 are connected to the signal line S2, and the two capacitors C1 and C3 are connected to the signal line S1, but the capacitors C3 and C4 may be omitted. When the capacitors C3 and C4 are omitted, the duty error is detected by the amount of charging of the capacitors C1 and C2 during the integration period.

A case was also described in the abovementioned embodiments in which the amplifier 120 and the latch circuit 130 constitute the duty correction signal generator for detecting the potential difference between the first and second capacitors C1 and C2 and generating a duty correction signal based on the detected potential difference. However, the duty correction signal generator is not limited to this configuration and may take various forms.

What is claimed is:

1. A duty detection circuit for detecting a duty of a clock signal, comprising:
    a first capacitor that is discharged during the time period in which the clock signal is at a high level and charged during the time period in which the clock signal is at a low level;
    a second capacitor that is charged during the time period in which the clock signal is at a high level and discharged during the time period in which the clock signal is at a low level; and
    a duty correction signal generator for detecting the potential difference of the first and second capacitors and outputting a duty correction signal based on the potential difference, wherein
    a discharging rate of the first and second capacitors is higher than a charging rate of the first and second capacitors.

2. The duty detection circuit as claimed in claim 1, further comprising:
    a first integration transistor for allowing the first capacitor to be charged during the time period in which the clock signal is at a low level;
    a second integration transistor for allowing the first capacitor to be discharged during the time period in which the clock signal is at a high level;

a third integration transistor for allowing the second capacitor to be charged during the time period in which the clock signal is at a high level;

a fourth integration transistor for allowing the second capacitor to be discharged during the time period in which the clock signal is low-level;

a first bias transistor for setting the rate at which the first and second capacitors are charged by defining the amount of bias current that flows to the first and third integration transistors; and a second bias transistor for setting the rate at which the first and second capacitors are discharged by defining the amount of bias current that flows to the second and fourth integration transistors.

3. The duty detection circuit as claimed in claim 2, wherein the first and third integration transistors and the first bias transistor are composed of P-channel MOS transistors; and the second and fourth integration transistors and the second bias transistor are composed of N-channel MOS transistors.

4. The duty detection circuit as claimed in claim 3, wherein the amount of bias current set by the second bias transistor is larger than the amount of bias current set by the first bias transistor.

5. The duty detection circuit as claimed in claim 4, wherein the ratio of the bias current by the first bias transistor to the bias current by the second bias transistor is set to 2:3.

6. The duty detection circuit as claimed in claim 1, further comprising a transfer controller for allowing charging and discharging of the first capacitor during a first period which is an integer multiple period of the clock signal and allowing charging and discharging of the second capacitor during a second period which is an integer multiple period of the clock signal.

7. The duty detection circuit as claimed in claim 6, further comprising a third capacitor provided so as to correspond to the first capacitor; and a fourth capacitor provided so as to correspond to the second capacitor; wherein the first and second capacitors are composed of N-channel MOS gate capacitors; and the third and fourth capacitors are composed of P-channel MOS gate capacitors.

8. The duty detection circuit as claimed in claim 1, further comprising a pre-charge unit for pre-charging the first and second capacitors at a lower level than the level of a pre-scribed power source.

9. The duty detection circuit as claimed in claim 8, wherein the pre-charge unit includes a first pre-charge transistor connected between the prescribed power source and the first capacitor; and a second pre-charge transistor connected between the prescribed power source and the second capacitor; and the first and second pre-charge transistors are both composed of N-channel MOS transistors.

10. The duty detection circuit as claimed in claim 1, further comprising a third capacitor provided so as to correspond to the first capacitor; and a fourth capacitor provided so as to correspond to the second capacitor; wherein the first and second capacitors are composed of N-channel MOS gate capacitors; and the third and fourth capacitors are composed of P-channel MOS gate capacitors.

11. The duty detection circuit as claimed in claim 1, wherein the duty correction signal generator includes an amplifier for amplifying the potential difference of the first and second capacitors; and a latch circuit for generating the duty correction signal based on the output of the amplifier.

12. A duty detection circuit for detecting a duty of a clock signal and generating a duty correction signal based on the duty, the duty detection circuit comprising:

a main circuit unit that includes at least a first capacitor that is discharged during the time period in which the clock signal is at a high level and charged during the time period in which the clock signal is at a low level, and a second capacitor that is charged during the time period in which the clock signal is at a high level and discharged during the time period in which the clock signal is at a low level, with the main circuit unit alternately charging or discharging the first and second capacitors in synchrony with the clock signal; and a duty correction signal generator for detecting the potential difference of the first and second capacitors and outputting a duty correction signal based on the potential difference, wherein the main circuit unit comprises:

a first integration transistor for allowing the first capacitor to be charged during the time period in which the clock signal is at a low level;

a second integration transistor for allowing the first capacitor to be discharged during the time period in which the clock signal is at a high level;

a third integration transistor for allowing the second capacitor to be charged during the time period in which the clock signal is at a high level;

a fourth integration transistor for allowing the second capacitor to be discharged during the time period in which the clock signal is low-level;

a first bias transistor for setting the rate at which the first and second capacitors are charged by defining the amount of bias current that flows to the first and third integration transistors; and a second bias transistor for setting the rate at which the first and second capacitors are discharged by defining the amount of bias current that flows to the second and fourth integration transistors, the amount of bias current set by the second bias transistor is larger than the amount of bias current set by the first bias transistor, and the ratio of the bias current by the first bias transistor to the bias current by the second bias transistor is set to 2:3, the duty detection circuit further comprising a transfer controller for allowing charging and discharging of the first and second capacitors at a prescribed timing that is synchronized with the clock signal, wherein the transfer controller allows charging and discharging of the first capacitor during a first period which is an integer multiple period of the clock signal and allowing charging and discharging of the second capacitor during a second period which is an integer multiple period of the clock signal.

13. The duty detection circuit as claimed in claim 12, wherein the transfer controller allows charging and discharging of the first and second capacitors based on at least a logical signal generated by an activation signal, the clock signal, and the delay signal thereof.

14. A duty detection circuit for detecting a duty of a clock signal and generating a duty correction signal based on the duty, the duty detection circuit comprising:

a main circuit unit that includes at least a first capacitor that is discharged during the time period in which the clock signal is at a high level and charged during the time period in which the clock signal is at a low level, and a second capacitor that is charged during the time period in which the clock signal is at a high level and discharged during the time period in which the clock signal is at a low level, with the main circuit unit alternately charging or discharging the first and second capacitors in synchrony with the clock signal; and a duty correction signal generator for detecting the potential difference of the first and second capacitors and outputting a duty correction signal based on the potential difference, wherein the main circuit unit comprises:

a first integration transistor for allowing the first capacitor to be charged during the time period in which the clock signal is at a low level;

a second integration transistor for allowing the first capacitor to be discharged during the time period in which the clock signal is at a high level;

a third integration transistor for allowing the second capacitor to be charged during the time period in which the clock signal is at a high level;

a fourth integration transistor for allowing the second capacitor to be discharged during the time period in which the clock signal is low-level;

a first bias transistor for setting the rate at which the first and second capacitors are charged by defining the amount of bias current that flows to the first and third integration transistors; and a second bias transistor for setting the rate at which the first and second capacitors are discharged by defining the amount of bias current that flows to the second and fourth integration transistors, the amount of bias current set by the second bias transistor is larger than the amount of bias current set by the first bias transistor, and the ratio of the bias current by the first bias transistor to the bias current by the second bias transistor is set to 2:3, the duty detection circuit further comprising a transfer controller for allowing charging and discharging of the first and second capacitors at a prescribed timing that is synchronized with the clock signal, wherein the transfer controller is configured so as to be able to allow charging and discharging of the first capacitor and charging and discharging of the second capacitor to occur independently.

15. The duty detection circuit as claimed in claim 14, wherein the transfer controller causes the time period in which charging and discharging of the first capacitor is allowed, and the time period in which charging and discharging of the second capacitor is allowed to be offset from each other by one-half cycle of the clock signal.

16. The duty detection circuit as claimed in claim 15, wherein the transfer controller causes charging and discharging of the second capacitor to be initiated one-half cycle of the clock signal after charging and discharging of the first capacitor is initiated.

17. A method for controlling a duty detection circuit for detecting a duty of a clock signal and generating a duty correction signal based on the duty, the duty detection circuit comprising:

a main circuit unit that includes at least a first capacitor that is discharged during the time period in which the clock signal is at a high level and charged during the time period in which the clock signal is at a low level, and a second capacitor that is charged during the time period in which the clock signal is at a high level and discharged during the time period in which the clock signal is at a low level, with the main circuit unit alternately charging or discharging the first and second capacitors in synchrony with the clock signal; and a duty correction signal generator for detecting the potential difference of the first and second capacitors and outputting a duty correction signal based on the potential difference, the method comprising:

causing charging and discharging of the first capacitor to be initiated at a prescribed timing that is synchronized with the clock signal; and causing charging and discharging of the second capacitor to be initiated at a timing that is one-half cycle of the clock signal later than the time at which charging and discharging of the first capacitor was initiated.

18. A duty detection circuit for detecting a duty of a clock signal, comprising:

first and second capacitors;

a first integration transistor charging the first capacitor when the clock signal is at a low level;

a second integration transistor discharging the first capacitor when the clock signal is at a high level;

a third integration transistor charging the second capacitor when the clock signal is at the high level;

a fourth integration transistor discharging the second capacitor when the clock signal is at the low level; and a transfer controller for allowing charging and discharging of the first capacitor during a first period which is an integer multiple period of the clock signal and allowing charging and discharging of the second capacitor during a second period which is different from the first period and is an integer multiple period of the clock signal.

19. The duty detection circuit as claimed in claim 18, wherein the transfer controller is configured for allowing charging and discharging of the first capacitor and charging and discharging of the second capacitor to occur independently.

20. The duty detection circuit as claimed in claim 18, wherein the transfer controller is configured for allowing charging and discharging of the first capacitor in response to a first activation signal, the transfer controller is configured for allowing charging and discharging of the second capacitor in response to a second activation signal, and the timing of activating the transfer controller by the first activation signal is different from that by the second activation signal.

21. The duty detection circuit as claimed in claim 20, wherein the first activation signal is changed in synchronism with a rising edge of the clock signal, and the second activation signal is changed in synchronism with a falling edge of the clock signal.

22. The duty detection circuit as claimed in claim 20, wherein the transfer controller includes:

a first transfer switch connected between the first capacitor and a first connection node of the first and second integration transistors; and a second transfer switch connected between the second capacitor and a second connection node of the third and fourth integration transistors, wherein the first transfer switch is controlled by the first activation signal and the second transfer switch is controlled by a second activation signal.

23. The duty detection circuit as claimed in claim 22, wherein
the first transfer switch turns on in synchronism with turning the second integration transistor on, and
the second transfer switch turns on in synchronism with turning the fourth integration transistor on.

24. The duly detection circuit as claimed in claim 22, further comprising:
an amplifier that amplifies an difference in electrical potentials of the first and second capacitors; and
a pre-charge circuit for pre-charging the first and second capacitors, the pre-charge circuit being connected between the transfer controller and the amplifier.

25. The duty detection circuit as claimed in claim 24, wherein
the first capacitor is connected to a power source in response to the first integration transistor turning on so as to charge the first capacitor,
the second capacitor is connected to the power source in response to the third integration transistor turning on so as to charge the second capacitor, and
the pre-charge circuit pre-charges the first and second capacitors at a lower level than the power source.

26. The duty detection circuit as claimed in claim 25, wherein the pre-charge circuit includes:
a first N-channel MOS transistor connected between the power source and the first capacitor; and
a second N-channel MOS transistor connected between the power source and the second capacitor.

27. The duty detection circuit as claimed in claim 20, wherein
the first and second integration transistors are controlled by a first internal clock signal, and
the third and fourth integration transistors are controlled by a second internal clock signal.

28. The duty detection circuit as claimed in claim 27, wherein
the transfer controller allows charging and discharging of the first capacitor based on at least a logical signal generated by the first activation signal, the first internal clock signal, and the delay signal thereof, and
the transfer controller allows charging and discharging of the second capacitor based on at least a logical signal generated by the second activation signal, the second internal clock signal, and the delay signal thereof.

29. The duty detection circuit as claimed in claim 18, further comprising:
a first bias transistor for setting charging rate of the first and second capacitors; and
a second bias transistor for setting discharging rate of the first and second capacitors.

30. The duty detection circuit as claimed in claim 29, wherein
the charging rate of the first and second capacitors can be controlled by a first bias signal, and
the discharging rate of the first and second capacitors can be controlled by a second bias signal different from the first bias signal.

31. The duty detection circuit as claimed in claim 30, wherein the charging rate and the discharging rate is different from each other.

32. A duty detection circuit for detecting a duty of a clock signal, comprising:
first and second capacitors;
a first integration transistor charging the first capacitor when the clock signal is at a low level;
a second integration transistor discharging the first capacitor when the clock signal is at a high level;
a third integration transistor charging the second capacitor when the clock signal is at the high level;
a fourth integration transistor discharging the second capacitor when the clock signal is at the low level; and
a transfer controller for allowing charging and discharging of the first and second capacitors, wherein the charging and discharging of the second capacitor is performed in a different time period from the charging and discharging of the first capacitor.

33. The duty detection circuit as claimed in claim 32, wherein
the transfer controller allows charging and discharging of the first capacitor in synchronism with a rising edge of the clock signal, and
the transfer controller allows charging and discharging of the second capacitor in synchronism with a falling edge of the clock signal.

34. A duty detection circuit for detecting a duty of a clock signal, comprising:
first and second capacitors;
a first integration transistor charging the first capacitor when the clock signal is at a low level;
a second integration transistor discharging the first capacitor when the clock signal is at a high level;
a third integration transistor charging the second capacitor when the clock signal is at the high level;
a fourth integration transistor discharging the second capacitor when the clock signal is at the low level; and
a transfer controller allowing charging and discharging of the first capacitor during a first period which starts in synchronism with a rising edge of the clock signal, and allowing charging and discharging of the second capacitor during a second period which is different from the first period and starts in synchronism with a falling edge of the clock signal.

* * * * *